United States Patent
Long et al.

(10) Patent No.: US 9,753,572 B2
(45) Date of Patent: Sep. 5, 2017

(54) TOUCH PANEL, METHOD OF FABRICATING THE SAME AND TOUCH DISPLAY DEVICE

(71) Applicants: BOE Technology Group Co., Ltd., Beijing (CN); Beijing BOE Optoelectronics Technology Co., Ltd., Beijing (CN)

(72) Inventors: Jun Long, Beijing (CN); Yi Zheng, Beijing (CN); Yong Song, Beijing (CN); Rui Li, Beijing (CN); Hongkun Zhang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 1 day.

(21) Appl. No.: 14/769,675

(22) PCT Filed: Nov. 28, 2014

(86) PCT No.: PCT/CN2014/092562
§ 371 (c)(1),
(2) Date: Aug. 21, 2015

(87) PCT Pub. No.: WO2016/026234
PCT Pub. Date: Feb. 25, 2016

(65) Prior Publication Data
US 2016/0253026 A1    Sep. 1, 2016

(30) Foreign Application Priority Data
Aug. 22, 2014    (CN) .......................... 2014 1 0419534

(51) Int. Cl.
*G06F 3/041*    (2006.01)
*G03F 7/20*    (2006.01)
(Continued)

(52) U.S. Cl.
CPC .............. *G06F 3/0416* (2013.01); *G03F 7/20* (2013.01); *G03F 7/32* (2013.01); *G06F 3/045* (2013.01);
(Continued)

(58) Field of Classification Search
None
See application file for complete search history.

(56) References Cited

U.S. PATENT DOCUMENTS

2009/0002336 A1    1/2009    Choi et al.

FOREIGN PATENT DOCUMENTS

CN    101477259 A    7/2009
CN    101896879 A    11/2010
(Continued)

OTHER PUBLICATIONS

May 22, 2015—International Search Report and Written Opinion Appn PCT/CN2014/092562 with English Tran.
(Continued)

*Primary Examiner* — Kenneth B Lee, Jr.
(74) *Attorney, Agent, or Firm* — Banner & Witcoff, Ltd.

(57) ABSTRACT

The embodiment of the present invention provides a touch panel, a method for manufacturing the touch panel and a touch display device. The touch panel includes a first substrate and a second substrate which is cell-assembled with the first substrate. A surface of the first substrate facing the second substrate is provided with a first touch electrode having a planar shape and a surface of the second substrate facing the second substrate is provided with a plurality of second touch electrodes and each of the second touch electrodes includes a strip electrode base and a plurality of electrode projections provided on the strip electrode base. Upon no touch operation being generated on the touch panel, all the electrode projections are insulated from the first touch
(Continued)

electrode; upon a touch operation being generated on the touch panel, the electrode projections on the touch point is contacted with the first touch electrode.

20 Claims, 4 Drawing Sheets

(51) Int. Cl.
  *G03F 7/32*  (2006.01)
  *G06F 3/045*  (2006.01)
(52) U.S. Cl.
  CPC .. *G06F 3/0412* (2013.01); *G06F 2203/04103* (2013.01); *G06F 2203/04104* (2013.01); *G06F 2203/04106* (2013.01)

(56) References Cited

FOREIGN PATENT DOCUMENTS

| CN | 102004343 A | 4/2011 |
| CN | 102707471 A | 10/2012 |
| CN | 102981297 A | 3/2013 |

OTHER PUBLICATIONS

Oct. 27, 2016—(CN) First Office Action Appn 201410419534.8 with English Tran.

TOUCH PANEL, METHOD OF FABRICATING THE SAME AND TOUCH DISPLAY DEVICE

The application is a U.S. National Phase Entry of International Application No. PCT/CN2014/092562 filed on Nov. 28, 2014, designating the United States of America and claiming priority to Chinese Patent Application No. 201410419534.8 filed on Aug. 22, 2014. The present application claims priority to and the benefit of the above-identified applications and the above-identified applications are incorporated by reference herein in their entirety.

TECHNICAL FIELD

The embodiments of the invention relates to a touch panel, a method of fabricating the touch panel and a touch display device comprising the touch panel.

BACKGROUND

The existing touch panel includes two types which are resistance touch panel and capacitive touch panel. The resistance touch panel is a sensor which can transfer physical position of a touch point (X, Y) in a rectangular area into voltage representing the coordinates of X and Y. Four resistance lines, five resistance lines, seven resistance lines or eight resistance lines are usually adopted to generate biased voltage on the screen and voltage of a touch point is read back at the same time. However, the resistance touch panel usually does not support multi-touch.

The capacitive touch panel supports multi-touch. Commonly, the capacitive touch panel includes a plurality of driving electrodes for touch signal and a plurality of sensing electrodes for touch signal. A capacitor is formed between the driving electrode for touch signal and the sensing electrode for touch signal in usage. A coupled capacitor can be formed between the user's finger and the sensing electrode for touch signal due to the electric field of the user when a user touch the capacitive touch panel by a finger. For high frequency current, the capacitor will be a direct conductor, thus the finger can absorb a small current from the touch point which will lead to a change of signal inside the sensing electrode for touch signal and the coordinates of the touch point can be determined according to the change of the signal.

If fingers of a user could not directly touch the touch panel (for example, in winter, when the user wears gloves), touching on the touch panel could not generate signal change inside the touch sensing electrode, thus the position of the touch point cannot be determined.

Therefore, it is a problem to be solved for those skilled in the art to develop a touch panel, which has function of multi-touch and can be able to determine the position of the touch point when the touch panel is indirectly touched by a finger of a user.

SUMMARY

An embodiment of the invention provides a touch panel comprising a first substrate and a second substrate which is cell-assembled with the first substrate, wherein, a surface of the first substrate facing the second substrate is provided with a first touch electrode having a planar shape, a surface of the second substrate facing the first substrate is provided with a plurality of second touch electrodes and each of the second touch electrodes includes a strip electrode base and a plurality of electrode projections provided on the strip electrode base, upon no touch operation being generated on the touch panel, all the electrode projections are insulated from the first touch electrode, upon a touch operation being generated on the touch panel, the electrode projections on the touch point is contacted with the first touch electrode.

In an example, the touch panel further comprises insulation spacers provided between the first substrate and the second substrate, two end faces of each of the insulation spacers are respectively contacted with the first substrate and the second substrate to make all the electrode projections being insulated from the first touch electrode upon no touch operation being generated on the touch panel.

In an example, each of the insulation spacers comprises a strip spacer base and a plurality of spacer projections on the strip spacer base, the strip spacer bases and the strip electrode bases are alternately provided on the second substrate.

In an example, the touch panel further comprises a connection piece for connecting the first substrate and the second substrate, and the connection piece and the insulation spacers are both made from resin.

In an example, the plurality of second touch electrodes is provided on the second substrate in parallel with one another and the adjacent second touch electrodes are isolated from each other.

In an example, a thickness of the second touch electrode in a direction perpendicular to the first substrate or the second substrate is less than an interval between the first substrate and the second substrate upon no touch operation being generated on the touch panel.

In an example, a thickness of the insulation spacers in the direction perpendicular to the first substrate or the second substrate is equal to the interval between the first substrate and the second substrate upon no touch operation being generated on the touch panel.

Another embodiment of the invention provides a touch display device comprising a touch panel and a display panel, wherein, the touch panel can be the touch panel according to anyone as mentioned above. The display device further includes a touch driving circuit, a first touch detection circuit, a second touch detection circuit and a reference voltage supply circuit. Either the first substrate or the second substrate is provided on the light exiting side of the display panel. The reference voltage supply circuit is electrically connected to the first touch electrode. The touch driving circuit is electrically connected to two ends of each of the second touch electrodes to supply voltage to the second touch electrodes and a voltage value supplied by the touch driving circuit is different from that supplied by the reference voltage supply circuit. The first touch detection circuit is electrically connected to an end of each of the second touch electrodes and the second touch detection circuit is electrically connected to another end of each of the second touch electrodes. The first touch detection circuit and the second touch detection circuit respectively detects current running through portions of each of the second touch electrodes at two sides of the touch point upon a touch operation being generated on the touch panel.

In an example, the display panel is a liquid display panel.

In an example, the second substrate is integrally formed with the substrate of the display panel on the light exiting side.

Still another embodiment of the invention provides a method for manufacturing a touch panel, comprising:

providing a first substrate, forming a first touch electrode with a planar shape on the first substrate, providing a second substrate, forming a plurality of second touch electrodes on the second substrate, wherein each of the second touch electrodes comprises a strip electrode base and a plurality of electrode projections on the strip electrode base, cell-assembling the first substrate having the first touch electrode and the second substrate having the second touch electrodes to obtain the touch panel, wherein, upon a touch operation being generated on the touch panel, the electrode projections on the touch point is contacted with the first touch electrode, upon no touch operation being generated on the touch panel, all the electrode projections are insulated from the first touch electrode.

In an example, the method further comprises: providing insulation spacers before cell-assembling the first substrate having the first touch electrode and the second substrate having the second touch electrodes. The insulation spacers are located on the first substrate or the second substrate. After the first substrate having the first touch electrode and the second substrate having the second touch electrodes being cell-assembled, two end faces of each of the insulation spacers are respectively contacted with the first substrate and the second substrate so that all the electrode projections are insulated from the first touch electrode upon no touch operation being generated on the touch panel.

In an example, forming the plurality of the second touch electrodes on the second substrate comprise:

forming a transparent electrode material layer, forming a first photoresist layer on the transparent electrode material layer, exposing the first photoresist layer with a first mask, wherein the first mask includes a first light transmissive region, a first half-transmissive region and a first light blocking region, the first light transmissive region corresponds to an interval between two adjacent second electrodes, the light blocking region corresponds to the electrode projections, the first half-transmissive region corresponds to an interval between two adjacent electrode projections on a same second touch electrode, developing the first photoresist layer after exposure to obtain a pattern corresponding to the second touch electrode on the first photoresist layer, etching the transparent electrode material layer with the pattern corresponding to the second touch electrode and formed on the first photoresist layer as a mask, so as to obtain a pattern including the second touch electrode.

In an example, the insulation spacers are located on the second substrate, providing the insulation spacers includes:

forming an insulation material layer on the second substrate having the second touch electrodes, forming the insulation spacers by a patterning process, each of the insulation spacers includes a strip spacer base and a plurality of spacer projections on the strip spacer base, the strip spacer base and the strip electrode base are alternately arranged on the second substrate.

In an example, the insulation spacers are located on the second substrate, providing the insulation spacers includes:

forming an insulation material layer on the second substrate having the second touch electrodes, forming a second photoresist layer on the insulation material layer, exposing the second photoresist layer with a second mask, wherein the second mask includes a second light transmissive region, a second half-transmissive region and a second light blocking region, the second light transmissive region corresponds to the second electrodes, the light blocking region corresponds to the spacer projections, the second half-transmissive region corresponds to an interval between two adjacent spacer projections on a same insulation spacer, developing the second photoresist layer after exposure to form a pattern corresponding to the insulation spacers on the second photoresist layer, etching the insulation material layer with the pattern corresponding to the insulation spacers and formed on the second photoresist layer as a mask, so as to obtain the insulation spacers.

In an example, cell-assembling the first substrate having the first touch electrode and the second substrate having the second touch electrodes includes:

providing sealant on an edge portion of the first substrate having the first touch electrode; and/or providing sealant on an edge portion of the second substrate having the second touch electrodes;

cell-assembling the first substrate having the first touch electrode and the second substrate having the second touch electrodes and solidifying the sealant to form a connection piece for connecting the first substrate and the second substrate, wherein, the sealant and the insulation spacers are both made from resin.

In an example, the plurality of second touch electrodes are provided on the second substrate in parallel with one another and the adjacent second touch electrodes are isolated from each other.

In an example, the plurality of the second touch electrodes and the insulation spacers are alternately provided in a direction perpendicular to an extending direction of the second touch electrodes.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
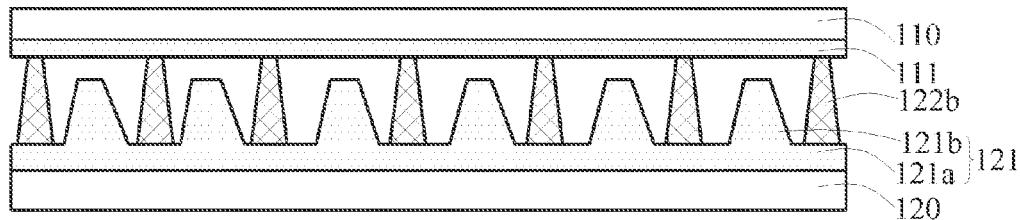
FIG. 1 is a schematic sectional view of a touch panel provided in the present invention in untouched state.
Figure 2:
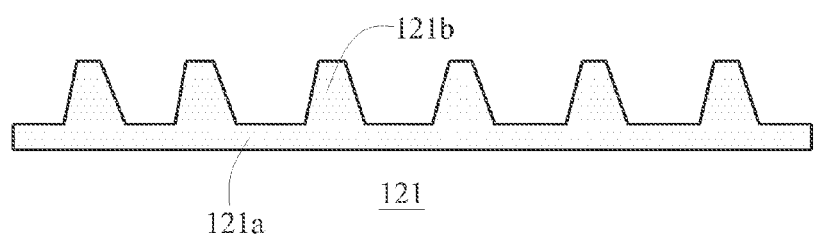
FIG. 2 is a schematic sectional view of a second electrode in the touch panel illustrated in FIG. 1.
Figure 4:
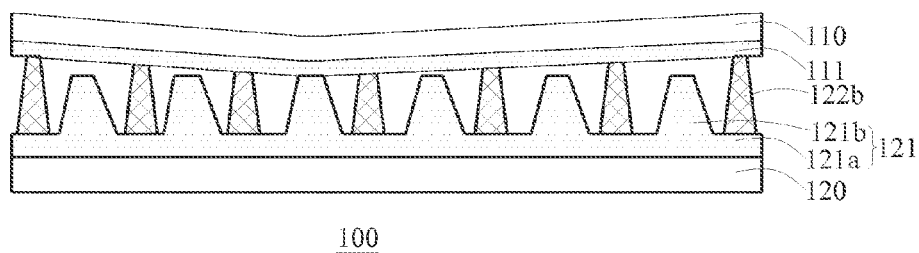
FIG. 4 is a schematic sectional view of a touch panel provided in the present invention in touched state.

As illustrated in FIG. 1 and FIG. 4, a touch panel 100 is provided as one aspect of the present invention. The touch panel 100 includes a first substrate 110 and a second substrate 120 which is cell-assembled with the first substrate 110. A surface of the first substrate 110 facing the second substrate 120 is provided with a first touch electrode 111 having a planar shape, and a surface of the second substrate 120 facing the first substrate 110 is provided with a plurality of second touch electrodes 121. Each of the second touch electrodes 121 includes a strip electrode base 121a and a plurality of electrode projections 121b provided on the strip electrode base 121a.

As illustrated in FIG. 1, upon no touch operation being generated on the touch panel 100, all the electrode projections 121b are insulated from the first touch electrode 111.

As illustrated in FIG. 4, upon a touch operation being generated on the touch panel 100, the electrode projections 121b at the touch point is contacted with the first touch electrode 111.

A constant reference voltage can be supplied to the first touch electrode 111 (for example, as an embodiment of the present invention, the first touch electrode 111 can be grounded and the reference voltage is a ground voltage GND, that is the reference voltage is zero) and a touch drive voltage can be supplied to the second touch electrode 121 if the touch panel 100 is used in a touch display device. The touch drive voltage is different from that of the reference voltage.

Upon no touch operation being generated on the touch panel, the first touch electrode 111 is spaced from the second touch electrode 121, thus no current generated in the touch panel 100.

Upon a touch operation being generated on the touch panel 100, a recession at the touch point of the substrate (anyone of the first substrate 110 and the second substrate 120) will be generated to make the first touch electrode 111 and the electrode projections 121b at the touch point of the second touch electrode 121 electrically connected. Since the value of the drive voltage is different from that of the reference voltage, a closed loop circuit can be formed upon the first touch electrode 111 and the electrode projections 121b of the second touch electrodes 121 contact with each other so as to create a current. The current can be used to determine the coordinates of the touch point.

Figure 5:
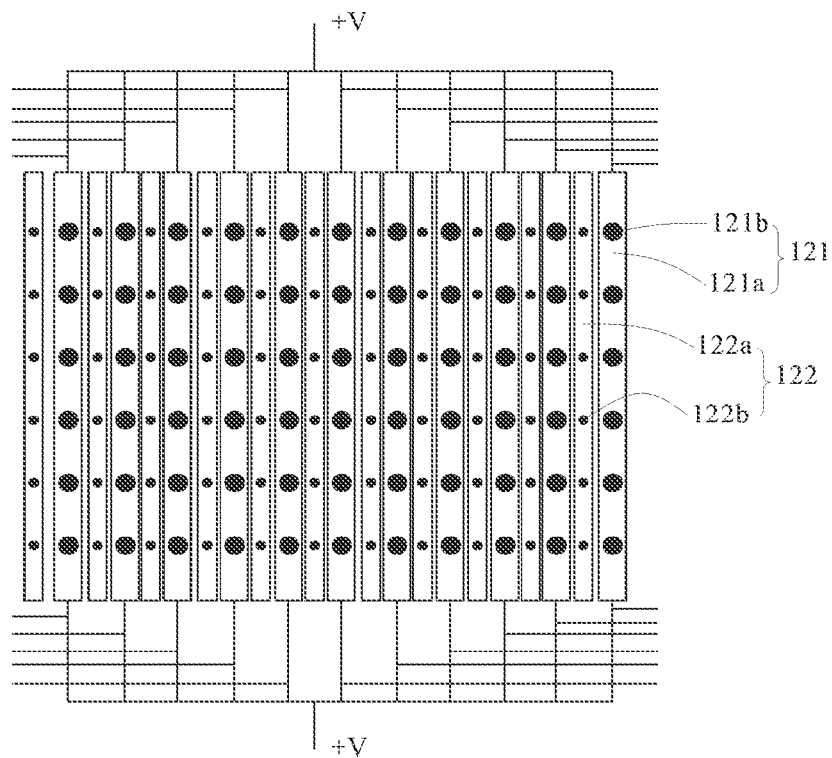
FIG. 5 is a schematic view showing a positional relation of a second electrode and an insulation spacer in a touch panel provided in the present invention.

As illustrated in FIG. 5, each of the touch panels comprises a plurality of second touch electrode 121 and two ends of each of the second electrodes are respectively connected to a touch detection circuit. Upon a touch operation being generated, a current will be generated only in the second touch electrode 121 under the touch point and no current generated in the second touch electrodes 121 on other positions. Therefore, the touch detection circuit can quickly determine the coordinates of the touch point in lateral direction of FIG. 5. As illustrated in FIG. 5, the plurality of second touch electrodes 121 are arranged in parallel with one another on the second substrate 120 and the two adjacent second touch electrodes 121 are isolated from each other. For example, the plurality of second touch electrodes 121 and insulation spacers are alternately provided in a direction perpendicular to the extending direction of the second touch electrodes 121.

As illustrated in FIG. 1, a thickness of the second touch electrode 121 (the total thickness of strip electrode base 121a and the electrode projections 121b) in a direction perpendicular to the first substrate or the second substrate is less than the interval between the first substrate and the second substrate upon no touch operation being generated on the touch panel. For example, a thickness of the insulation spacers 122 in the direction perpendicular to the first substrate or the second substrate is equal to the interval between the first substrate and the second substrate upon no touch operation being generated on the touch panel.

Figure 6:
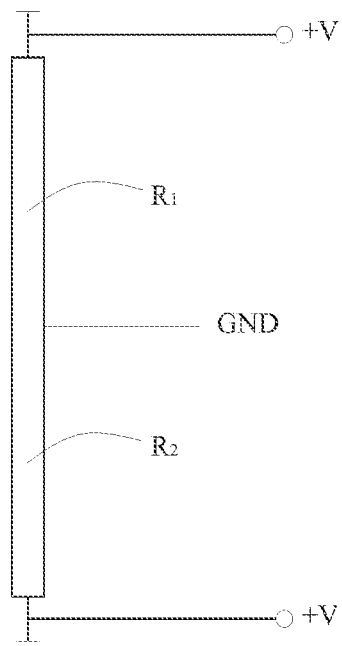
FIG. 6 is a principle schematic view of determining coordinates of a touch point on a touch panel provided in the present invention.

As illustrated in FIG. 4 and FIG. 6, since the electrode projections are provided on the second touch electrode 121 and only the electrode projections under the touch point of the second touch electrode 121 can be electrically connected to the first touch electrode 111, the second touch electrode 121 can be divided into two portions, which are respectively a portion on one side of the touch point and a portion on another side of the touch point. Electric potential on the touch point is zero (in a case that the reference voltage is zero) and the electric potential on two ends of the second touch electrodes 121 are both V.

The position of each of the electrode projections on the second touch electrode 121 is uniquely determined. The resistances (respectively R1 and R2 illustrated in FIG. 6) on two sides of an electrode projection contacted with the first touch electrode 111 are different according to the position of the electrode projection contacting with the first touch electrode 111. Therefore, two types of current can be generated respectively on portions of the second touch electrode 121 at two sides of the touch point, which can determine the coordinate of the touch point in longitudinal direction as illustrated in FIG. 5. Specifically, a portion of the second touch electrode 121 on one side of the touch point is a first resistance portion R1 and a portion of the second touch electrode 121 on the other side of the touch point is a second resistance portion R2, as illustrated in FIG. 6. The current $I_1$, which runs through the first resistance portion R1, is calculated by use of the equation (1), and the current $I_2$, which runs through the second resistance R2, is calculated by use of the equation (2). The coordinate y of the touch point in longitudinal direction in FIG. 5 can be determined by use of equation (3):

$$I_1 = (+V)/R_1 \quad (1);$$

$$I_2 = (+V)/R_2 \quad (2);$$

$$Y = I_1/I_2 \quad (3).$$

What is described above is a method to determine coordinates of a touch point. It is easily understandable that coordinates of a plurality of touch points can be determined with the method mentioned above to achieve multi-touch effect upon multiple touch points being generated on the touch panel.

As described above, whether the operator touch the touch panel 100 directly or indirectly, or touch the touch panel 100 by using other non-conductive objects, current will be generated in the touch panel 100 if the pressure applied on the touch panel is enough to make the first touch electrode 111 and the second touch electrode 121 being contacted. The coordinates of the touch point can be determined according to the current. Therefore, the touch panel provided in the embodiment of the present invention can be more widely used than a capacitive touch screen of traditional type. The touch panel provided in the present invention supports multi-touch compared with a traditional resistance-type touch screen, which further expands the application of the touch panel provided in the present invention.

In the embodiment of the present invention, either the first substrate 110 or the second substrate 120 can be arranged to face the operator when the touch panel 100 is used in a touch display device. For example, a deformation is able to be generated when the substrate facing the operator is touched. The first substrate 110 faces the operator in the embodiment illustrated in FIG. 1 and FIG. 4. However, embodiments of the present invention is not limited to this, the second substrate 120 can also be arranged to face the operator. It is easily understandable that the first touch electrode 111 has a planar shape and the first touch electrode 111 and the second touch electrode 121 are both made from transparent electrode material (for example, indium tin oxide ITO). The first substrate 110 is able to generate a deformation, and polyethylene terephthalate (PET) can be used to produce the first substrate.

In order to make all the electrode projections spaced from the first touch electrode upon no touch operation being generated on the touch panel, for example, as illustrated in FIG. 1 and FIG. 4, the touch panel 100 can further include an insulation spacers 122 provided between the first substrate 110 and the second substrate 120. The two end faces of the insulation spacers 122 are respectively contacted with the first substrate 110 and the second substrate 120 upon no touch operation being generated on the touch panel 100 to make all the electrode projections 121b being insulated and spaced from the first touch electrode 110.

In the embodiment of the present invention, the specific shape of the insulation spacers 122 is not particularly restricted. However, the spacer should be able to be provided between the first substrate 110 and the second substrate 120 for support and make all the electrode projections 121b being insulated and spaced from the first touch electrode 111 upon no touch operation being generated on the touch panel 100.

Figure 3:
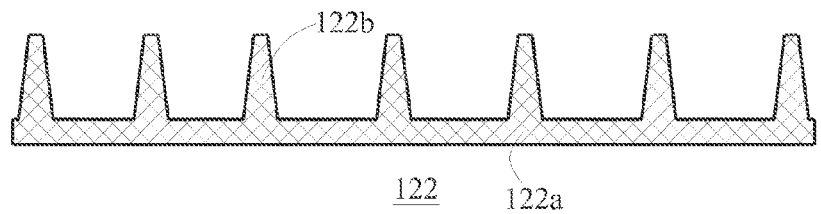
FIG. 3 is a schematic sectional view of an insulation spacer in the touch panel illustrated in FIG. 1.

As a specific embodiment of the present invention as illustrated in FIG. 3 and FIG. 5, each of the insulation spacers 122 comprises a strip spacer base 122a and a plurality of spacer projections 122b provided on the strip spacer base 122a. The strip spacer base 122a and the strip electrode base 121a are alternately arranged on the second substrate 120.

The insulation spacers 122 can reliably support the first substrate 110 and the second substrate 120 since the strip spacer 122a and the strip electrode base 121a are alternately arranged. In current technology, a plurality of independent spacers are adopted to make two substrates of a touch screen being separated, thus, spacers can easily shift for designated position due to a press on the screen by an operator, leading to a nonuniform distribution of the spacers. The spacer projection 122b on the insulation spacer 122 is connected via the strip spacer base 122a in the touch panel provided in the present invention, thus, the spacer projections cannot easily shift from their designated positions due to a press being generated on the first substrate by an operator, thus ensuring the first substrate and the second substrate are uniformly spaced and insulated upon no touch operation being generated.

As a specific embodiment of the present invention, the insulation spacers 122 can be provided on the first substrate 110. It is easily understandable for those skilled in the art the spacer projection 122b protrudes in a direction from the second substrate to the first substrate as compared with the electrode projection 121b. For example, the spacer projection protrudes from the electrode projection by 1000 to 2000 angstrom. The spacer projection 122b can contact with the first substrate upon no touch operation being generated to prevent the electrode spacer 121b from being contacted with the first touch electrode 111.

It is easily understandable for those skilled in the art that the first substrate 111 and the second substrate 120 are connected with each other. In an embodiment of the present invention, sealant can be used to make the first substrate 110 and the second substrate 120 being connected. As an embodiment of the present invention, the touch panel can further comprises a connection piece (not illustrated) for connecting the first substrate 110 and the second substrate 120 and the connection piece are made from same material as that used for making the insulation spacers.

Figure 7:
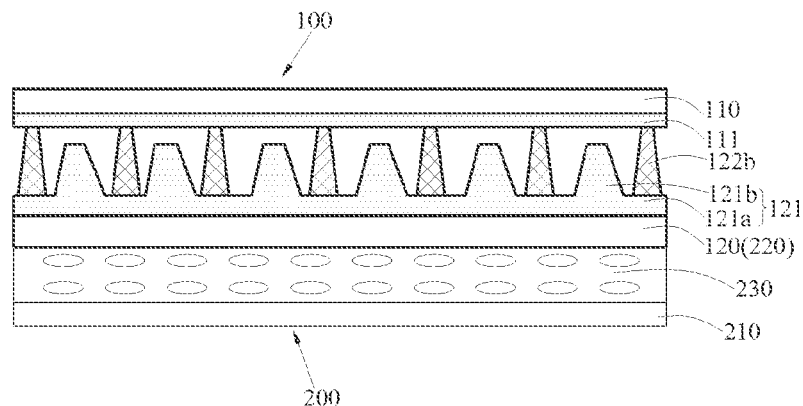
FIG. 7 is a schematic sectional view of a touch display device provided in the present invention.
Figure 9:
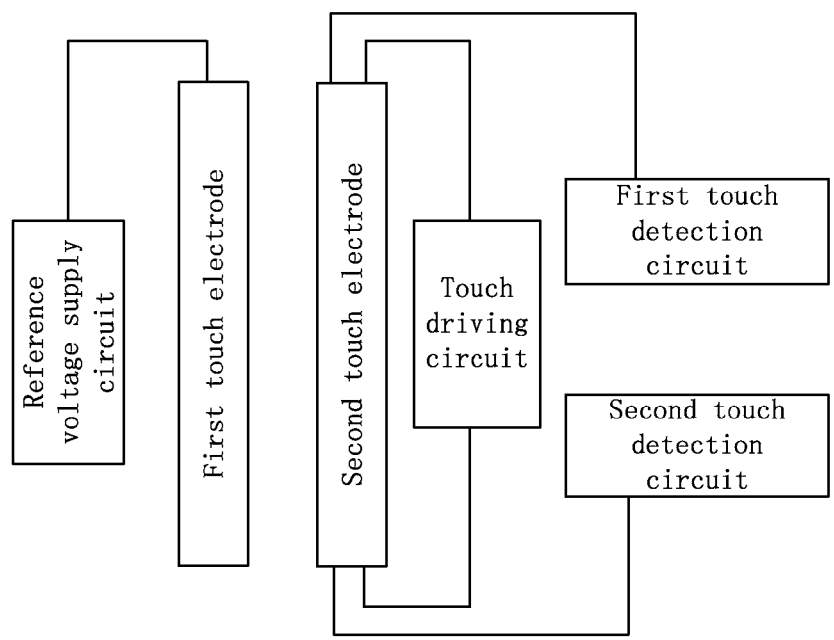
FIG. 9 is a functional block diagram exemplarily illustrating connections of the primary parts in a touch display device.

As another aspect of the present invention, a touch display device is provided as illustrated in FIG. 7. The touch display device comprises a touch panel 100 and a display panel 200. The touch panel 100 is the touch panel provided according to the embodiments of the present invention. The touch display device further comprises a touch driving circuit (not illustrated), a first touch detection circuit (not illustrated), a second touch detection circuit (not illustrated) and a reference voltage supply circuit (not illustrated). FIG. 9 is a functional block diagram which exemplarily illustrates connection relationship of primary parts in the touch display device. Either the first substrate 110 or the second substrate 120 is provided on the light exiting side of the display panel 200; the reference voltage supply circuit is electrically connected to the first touch electrode 111; the first touch detection circuit is electrically connected to an end of the second touch electrode and the second touch detection circuit is electrically connected to another end of the second touch electrode; the touch driving circuit is electrically connected to two ends of the second touch electrode to supply voltage to the second touch electrode and a voltage value supplied by the touch driving circuit is different from that supplied by the reference voltage supply circuit. The first detection circuit and the second touch detection circuit respectively detects a current running through portions of the second touch electrode at two sides of the touch point upon a touch operation being generated on the touch panel.

As mentioned above, no current is generated in the touch panel because the first touch electrode 111 and the second touch electrode 121 are spaced and insulated from each other upon no touch operation being generated on the touch panel.

Current is only generated in the second touch electrode 121 under the touch point and no current is generated in other second touch electrodes upon a touch point being generated on the touch panel. Therefore, the first touch detection circuit and the second touch detection circuit can quickly determine the coordinate of the touch point in lateral direction illustrated in FIG. 5.

As illustrated in FIG. 4 and FIG. 6, since the electrode projections are provided on the second touch electrode 121, and only the electrode projection under the touch point is electrically connected to the first touch electrode 111, the second touch electrode 121 can be divided into two portions, which are respectively a portion on one side of the touch point and a portion on another side of the touch point. Electric potential on the touch point is the reference voltage (can be zero) supplied by the reference voltage supply circuit and the electric potential on two ends of the second touch electrodes 121 are both the voltage (V) supplied by the touch driving circuit.

The position of each of the electrode projections on the second touch electrode 121 is uniquely determined. The resistances on two sides of the electrode projection (respectively R1 and R2 illustrated in FIG. 6) contacted with the first touch electrode 111 are different according to the position of the electrode projection contacted with the first touch electrode 111. Therefore, two types of current can be generated respectively on portions of the second touch electrode 121 at two sides of the touch point, by which the coordinate of the touch point in longitudinal direction as illustrated in FIG. 5 can be determined. Specifically, a portion of the second touch electrode 121 on one side of the touch point is a first resistance portion R1 and a portion of the second touch electrode 121 on the other side of the touch point is a second resistance portion R2, as illustrated in FIG. 6. The current I1, which runs through the first resistance portion R1, can be calculated by use of the equation (1), and the current I2, which runs through the second resistance R2, can be calculated by use of the equation (2). The coordinate y of the touch point in longitudinal direction in FIG. 5 can be determined by use of equation (3). The first touch detection circuit can detect the current I1 and the second touch detection circuit can detect the current I2.

The second touch electrode 121 can be electrically connected to the first touch detection circuit and the second touch detection circuit by use of a lead wire as illustrated in FIG. 5.

The touch display device provided in the embodiment of the present invention can be an electronic device such as a cell phone or a tablet computer.

In the embodiment of the present invention, the value of the reference voltage is not specifically limited, as long as it is different from the voltage supplied by the touch driving circuit. As a preferable embodiment of the present invention, the reference voltage supplied by the reference voltage supply circuit can be the ground voltage.

In the embodiment of the present invention, types of the display panel are not specifically limited. For example, the display panel can be an OLED display panel, an electroluminescence display panel or a liquid display panel. In the embodiment illustrated in FIG. 7, the display panel is a liquid display panel. The display panel 200 comprises an array substrate 210, a counter substrate 220 which is cell-assembled with the array substrate 210 and a liquid layer 230 filled between the array substrate 210 and the counter substrate 220.

The first substrate 110 can be formed as a polarizer if the touch panel is used in a liquid display panel. That is, a polarizer is formed on a light incidence face of a display panel (that is the lower surface of the array substrate 210) and the substrate 110 is also formed to be a polarizer. The polarization direction of the first substrate is perpendicular to the polarization direction of the polarizer located on the light incidence face of the display panel.

The second substrate 120 is integrally formed with the substrate on the light exiting side of the display panel 200 in order to reduce the total thickness of the touch display device. That is to say, the second substrate 120 is integrally formed with the counter substrate 220.

Figure 8A:
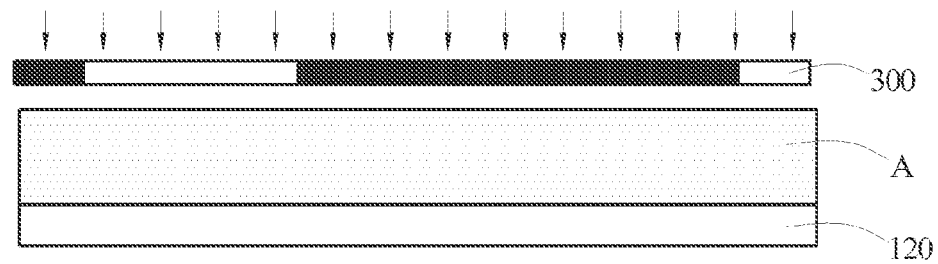
FIG. 8a to FIG. 8d are schematic views of semi-finished products in each step of fabricating a touch panel provided in the present invention.
Figure 8B:
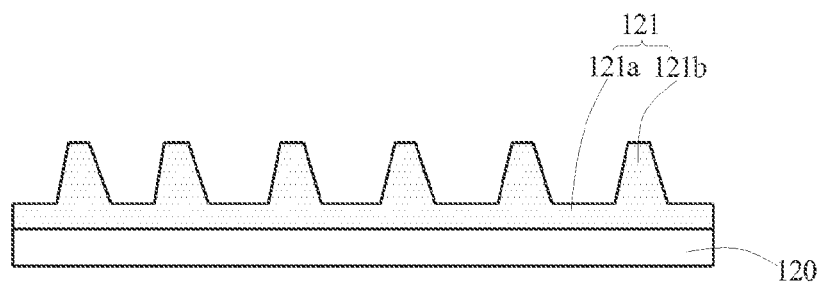
Figure 8C:
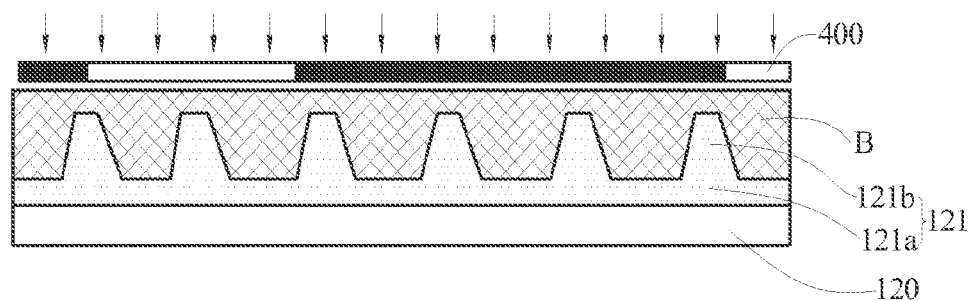
Figure 8D:
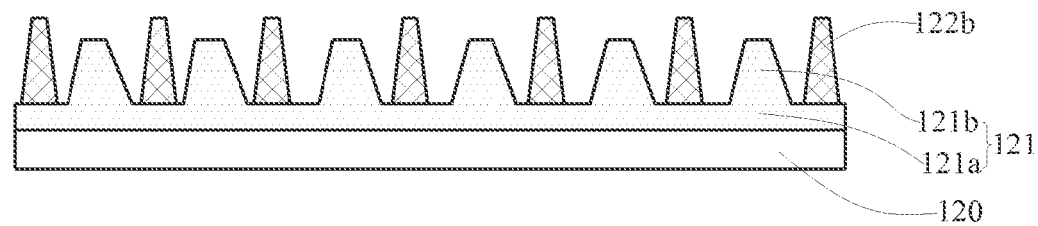
Figure 8E:
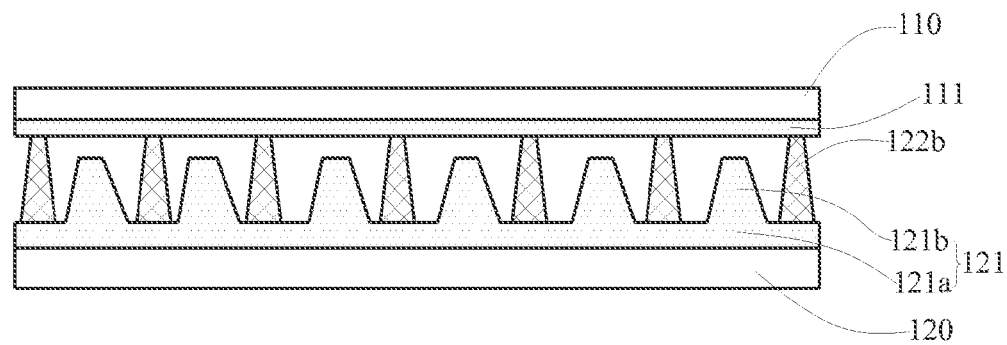
FIG. 8e is a schematic view of a touch panel provided in the present invention.

As a further aspect of the present invention, a method for manufacturing a touch panel is provided in the embodiments of the present invention, wherein, the fabrication method comprises: providing a first substrate 110; forming a first touch electrode 111 with a planar shape on the first substrate 110; providing a second substrate 120; forming a second touch electrode 121 on the second substrate 121, the second touch electrode 121 comprising a strip electrode base 121a and a plurality of electrode projections 121b provided on the strip electrode base 121a; and cell-assembling the first substrate 110 having the first touch electrode 111 and the second substrate 120 having the second touch electrode 121 to obtain the touch panel as illustrated in FIG. 8e.

Upon a touch operation being generated on the touch panel, the electrode projections at the touch point is contacted with the first touch electrode; upon no touch operation being generated on the touch panel, all the electrode projections are insulated from the first touch electrode.

The method of providing the first touch electrode 111 with a planar shape on the first substrate 110 is not specifically restricted in the embodiment of the present invention. For example, the first touch electrode 111 can be formed by a method such as sputtering or evaporation.

The method of providing the second touch electrode 121 on the second substrate 120 is not specifically restricted, too. For example, the second touch electrode can be formed by a method such as the traditional lithography patterning technique or transferring patterning technique.

In the embodiment illustrated in FIG. 8, a lithography process is adopted to form the second touch electrode 121 and steps of forming the second touch electrode 121, for example, comprises: forming a transparent electrode material layer A on the second substrate 120; forming a first photoresist layer on the transparent electrode material layer A (not shown); exposing the first photoresist layer with a first mask 300 (as illustrated in FIG. 8a); developing the first photoresist layer after exposure to obtain a pattern corresponding to the second touch electrode on the first photoresist layer; and etching the transparent electrode material layer with the pattern corresponding to the second touch electrode and formed on the first photoresist layer as a mask, so as to obtain a pattern comprising the second touch electrode 121 (as illustrated in FIG. 8b). The solid arrow in FIG. 8a indicates a direction of light emitted towards a mask. The first mask 300 can be a half tone mask to simplify the process. Specifically, the first mask 300 comprises a first light transmissive region, a first half-transmissive region and a first light blocking region, the first light transmissive region corresponds to an interval between two adjacent second electrodes, the light blocking region corresponds to the electrode projections, the first half-transmissive region corresponds to an interval between two adjacent electrode projections on a same second touch electrode.

As mentioned above, the touch panel includes insulation spacers to keep the first substrate and the second substrate spaced. Correspondingly, the fabrication method further includes the following steps carried out before cell-assembling the first substrate having the first touch electrode and the second substrate having the second touch electrode: providing insulation spacers 122 and the insulation spacers being located on the first substrate 110 or the second substrate 120. After cell-assembling the first substrate 110 having the first touch electrode 111 and the second substrate 120 having the second touch electrode 121, two end faces of each of the insulation spacers will be respectively contacted with the first substrate and the second substrate upon no touch operation being generated on the touch panel to make all the electrode projections being insulated from the first touch electrode.

The insulation spacer can have a structure as illustrated in FIG. 3, and the insulation spacer is provided on the second substrate. Steps of providing the insulation spacers include: forming a insulation material layer B on the second substrate having the second touch electrodes; and forming the insulation spacers by a patterning process, and each of the insulation spacers includes a strip spacer base and a plurality of spacer projections provided on the strip spacer base, the strip spacer base and the strip electrode base are alternately arranged on the second substrate.

The second mask 400 used in the lithography process in the steps of forming the insulation spacers can also be a half tone mask. Specifically, the steps of forming the insulation spacers can include: forming a insulation material layer B on the second substrate having the second touch electrodes; forming a second photoresist layer on the insulation material layer (not illustrated); exposing the second photoresist layer with a second mask 400 (as illustrated in FIG. 8c), wherein, the second mask includes a second light transmissive region, a second half-transmissive region and a second light blocking region, the second light transmissive region corresponds to the second touch electrodes, the light blocking region corresponds to the spacer projections, the second half-transmissive region corresponds to an interval between two adjacent spacer projections on a same insulation spacer; developing the second photoresist layer after exposure to form a pattern corresponding to the insulation spacers on the second photoresist layer; and etching the insulation material layer with the pattern corresponding to the insulation spacers and formed on the second photoresist layer as a mask, so as to obtain a pattern comprising the insulation spacers (as illustrated in FIG. 8d). As mentioned above, the spacer projection should be higher than that of the electrode projection.

Steps of cell-assembling the first substrate having the first touch electrode and the second substrate having the second touch electrode include: providing an insulation frame on an edge portion of the first substrate having the first touch electrode, and/or providing an insulation frame on an edge portion of the second substrate having the second touch electrodes; cell-assembling the first substrate having the first touch electrode and the second substrate having the second touch electrodes and solidifying the resin to form a connection piece for connecting the first substrate and the second substrate. The insulation frame and the insulation spacers are made from resin.

The connection piece made from resin material has a relative better transmittance compared with the traditional sealant.

The insulation spacers and the second touch electrodes can be directly formed on the counter substrate if the second substrate of a touch panel is integrally formed with the counter substrate of a display panel. It should be understood by those skilled in the art the insulation spacers and the second touch electrode are formed on a surface of the counter substrate opposite to the surface with color filters formed thereon of the counter substrate.

It should be noted that FIGS. 1, 7, 8d, 8e and the like are sectional views along the extending direction of the second touch electrode. Therefore, the second touch electrode and the insulation spacer should be illustrated in different sectional views. However, they are displayed in a same sectional view to more clearly explain corresponding relations of the second touch electrode sand the insulation spacers with respect to an upper substrate.

The foregoing is merely exemplary embodiments of the invention, but is not used to limit the protection scope of the invention. The protection scope of the invention shall be defined by the attached claims.

This application claims the benefit of Chinese patent application No. 201410419534.8 filled on Aug. 22, 2014, which is incorporated herein on its entirety as a part of the present application.

The invention claimed is:

1. A touch panel, comprising a first substrate and a second substrate which is cell-assembled with the first substrate, wherein, a surface of the first substrate facing the second substrate is provided with a first touch electrode having a planar shape, a surface of the second substrate facing the first substrate is provided with a plurality of second touch electrodes, and each of the second touch electrodes includes a strip electrode base and a plurality of electrode projections provided on the strip electrode base, upon no touch operation being generated on the touch panel, all the electrode projections are insulated from the first touch electrode, and upon a touch operation being generated on the touch panel, the electrode projections at the touch point is contacted with the first touch electrode, wherein the first touch electrode can be supplied with a constant reference voltage, each of the second touch electrodes can be supplied with a touch drive voltage different from the reference voltage, and a closed loop circuit can be formed upon the first touch electrode and the electrode projection of the second touch electrode contact with each other.

2. The touch panel according to claim 1, wherein, the touch panel further comprises insulation spacers provided between the first substrate and the second substrate, two end faces of each of the insulation spacers are respectively contacted with the first substrate and the second substrate to make all the electrode projections being insulated from the first touch electrode upon no touch operation being generated on the touch panel.

3. The touch panel according to claim 2, wherein, each of the insulation spacers comprises a strip spacer base and a plurality of spacer projections on the strip spacer base, the strip spacer bases and the strip electrode bases are alternately provided on the second substrate.

4. The touch panel according to claim 3, further comprises a connection piece for connecting the first substrate and the second substrate, and the connection piece and the insulation spacers are both made from resin.

5. The touch panel according to claim 1, wherein, the plurality of second touch electrodes are provided on the second substrate in parallel with one another and the adjacent second touch electrodes are isolated from each other.

6. The touch panel according to claim 1, wherein, a thickness of the second touch electrode in a direction perpendicular to the first substrate or the second substrate is less than an interval between the first substrate and the second substrate upon no touch operation being generated on the touch panel.

7. The touch panel according to claim 2, wherein, a thickness of the insulation spacers in a direction perpendicular to the first substrate or the second substrate is equal to an interval between the first substrate and the second substrate upon no touch operation being generated on the touch panel.

8. A touch display device, comprising a touch panel and a display panel, wherein, the touch panel is the touch panel according to claim 1; the display device further includes a touch driving circuit, a first touch detection circuit, a second touch detection circuit and a reference voltage supply circuit; either the first substrate or the second substrate is provided on the light exiting side of the display panel; the reference voltage supply circuit is electrically connected to the first touch electrode; the touch driving circuit is electrically connected to two ends of each of the second touch electrodes to supply voltage to the second touch electrodes and a voltage value supplied by the touch driving circuit is different from that supplied by the reference voltage supply circuit; the first touch detection circuit is electrically connected to an end of each of the second touch electrodes and the second touch detection circuit is electrically connected to another end of each of the second touch electrodes; the first touch detection circuit and the second touch detection circuit are respectively configured to detect current running through portions of each of the second touch electrodes at two sides of a touch point upon a touch operation being generated on the touch panel.

9. The touch display device according to claim 8, wherein, the display panel is a liquid display panel.

10. The touch display device according to claim 8, wherein, the second substrate is integrally formed with a substrate of the display panel on the light exiting side.

11. A method for manufacturing a touch panel, comprising:
providing a first substrate,
forming a first touch electrode with a planar shape on the first substrate,
providing a second substrate,
forming a plurality of second touch electrodes on the second substrate, wherein each of the second touch electrodes comprises a strip electrode base and a plurality of electrode projections on the strip electrode base,
cell-assembling the first substrate having the first touch electrode and the second substrate having the second touch electrodes to obtain the touch panel, wherein,
upon a touch operation being generated on the touch panel being touched, the electrode projections at the touch point is contacted with the first touch electrode,
upon no touch operation being generated on the touch panel, all the electrode projections are insulated from the first touch electrode,
wherein the first touch electrode can be supplied with a constant reference voltage, each of the second touch electrodes can be supplied with a touch drive voltage different from the reference voltage, and a closed loop circuit can be formed upon the first touch electrode and the electrode projection of the second touch electrode contact with each other.

12. The method for manufacturing the touch panel according to claim 11, further comprising: providing insulation spacers before cell-assembling the first substrate having the first touch electrode and the second substrate having the second touch electrodes, the insulation spacers being located on the first substrate or the second substrate, wherein, after the first substrate having the first touch electrode and the second substrate having the second touch electrodes being cell-assembled, two end faces of each of the insulation spacers are respectively contacted with the first substrate and the second substrate to make all the electrode projections being insulated from the first touch electrode upon no touch operation being generated on the touch panel.

13. The method for manufacturing the touch panel according to claim 11, wherein, providing the plurality of second touch electrodes on the second substrate comprises:
forming a transparent electrode material layer,
forming a first photoresist layer on the transparent electrode material layer,
exposing the first photoresist layer with a first mask, wherein, the first mask comprises a first light transmissive region, a first half-transmissive region and a first light blocking region, the first light transmissive region corresponds to an interval between two adjacent second electrodes, the light blocking region corresponds to the electrode projections, the first half-transmissive region corresponds to an interval between two adjacent electrode projections on a same second touch electrode,
developing the first photoresist layer after exposure to obtain a pattern corresponding to the second touch electrode on the first photoresist layer,
etching the transparent electrode material layer with the pattern corresponding to the second touch electrode and formed on the first photoresist layer as a mask, so as to obtain a pattern comprising the second touch electrodes.

14. The method for manufacturing the touch panel according to claim 12, wherein, the insulation spacers are located on the second substrate, providing the insulation spacers includes:
forming a insulation material layer on the second substrate having the second touch electrodes,
forming the insulation spacers by a patterning process, each of the insulation spacers includes a strip spacer base and a plurality of spacer projections on the strip spacer base, the strip spacer bases and the strip electrode bases are alternately arranged on the second substrate.

15. The method for manufacturing the touch panel according to claim 12, wherein, the insulation spacers are located on the second substrate, providing the insulation spacers includes:
forming a insulation material layer on the second substrate having the second touch electrodes,
forming a second photoresist layer on the insulation material layer,
exposing the second photoresist layer with a second mask, wherein, the second mask includes a second light transmissive region, a second half-transmissive region and a second light blocking region, the second light transmissive region corresponds to the second touch electrodes, the light blocking region corresponds to the spacer projections, the second half-transmissive region corresponds to an interval between two adjacent spacer projections on a same insulation spacer,
developing the second photoresist layer after exposure to form a pattern corresponding to the insulation spacers on the second photoresist layer,
etching the insulation material layer with the pattern corresponding to the insulation spacers and formed on the second photoresist layer as a mask, so as to obtain the insulation spacers.

16. The method for manufacturing the touch panel according to claim 12, wherein, cell-assembling the first substrate having the first touch electrode and the second substrate having the second touch electrodes includes:
providing sealant on an edge portion of the first substrate having the first touch electrode, and/or providing sealant on an edge portion of the second substrate having the second touch electrodes;

cell-assembling the first substrate having the first touch electrode and the second substrate having the second touch electrodes and solidifying the sealant to form a connection piece for connecting the first substrate and the second substrate, wherein, the sealant and the insulation spacers are both made from resin.

17. The method for manufacturing the touch panel according to claim 12, wherein, the plurality of second touch electrodes are provided on the second substrate in parallel with one another and the adjacent second touch electrodes are isolated from each other.

18. The method for manufacturing the touch panel according to claim 17, wherein, the plurality of second touch electrodes and the insulation spacers are alternately provided in a direction perpendicular to an extending direction of the second touch electrodes.

19. The touch panel according to claim 4, further comprises a connection piece for connecting the first substrate and the second substrate, and the connection piece and the insulation spacers are both made from resin.

20. The touch panel according to claim 2, wherein, the plurality of second touch electrodes are provided on the second substrate in parallel with one another and the adjacent second touch electrodes are isolated from each other.

* * * * *